United States Patent [19]
Dhong et al.

[11] Patent Number: 5,212,616
[45] Date of Patent: May 18, 1993

[54] VOLTAGE REGULATION AND LATCH-UP PROTECTION CIRCUITS

[75] Inventors: Sang H. Dhong, Mahopac; Robert L. Franch, Wappingers Falls, both of N.Y.

[73] Assignee: International Business Machines Corporation, Armonk, N.Y.

[21] Appl. No.: 781,446

[22] Filed: Oct. 23, 1991

[51] Int. Cl.[5] .............................................. H02H 7/10
[52] U.S. Cl. ...................................... 361/18; 361/58; 361/88
[58] Field of Search .................. 361/18, 58, 54, 56, 361/57, 88, 93; 357/23.13

[56] References Cited

U.S. PATENT DOCUMENTS

| | | | |
|---|---|---|---|
| 4,008,418 | 2/1977 | Murphy | 361/18 |
| 4,021,701 | 5/1977 | Davies | 361/18 |
| 4,547,828 | 10/1985 | Bloomer | 361/86 |
| 4,594,633 | 6/1986 | Townsend et al. | 361/57 |
| 4,723,081 | 2/1988 | Akatsuka | 307/200 B |
| 4,731,574 | 3/1988 | Melbert | 361/18 |
| 4,761,702 | 8/1988 | Pinard | 361/18 |

FOREIGN PATENT DOCUMENTS

0372842A2  6/1990  European Pat. Off. .

OTHER PUBLICATIONS

Zappe, H. P., "Switchable Power Supply to Prevent Latchup Damage to CMOS Integrated Circuits", IBM Technical Disclosure Bulletin, vol. 27, No. 9, pp. 5038–5040, 1985.

*Primary Examiner*—A. D. Pellinen
*Assistant Examiner*—S. Jackson
*Attorney, Agent, or Firm*—Heslin & Rothenberg

[57] ABSTRACT

An improved latch-up protection circuit is disclosed which prevents damage to a CMOS integrated circuit chip due to transient surges or internal-circuitry initiated latch-ups and which clears any latch-up condition or SCR mode. In each embodiment, the latch-up protection circuit is integrated with an on-chip voltage regulation circuit which provides on-chip power to the internal chip circuitry. A first approach to implementing the latch-up protection circuit is to detect an average current through the power transistor of the voltage regulation circuit over a few microseconds. Should the average current exceed a preset value, then the power transistor is turned off and the power ($V_{DDI}$) supplied to the internal chip circuitry is reduced to zero, thereby removing the latch-up condition. In a second approach, the on-chip voltage ($V_{DDI}$) supplied to internal chip circuitry is compared with a reference voltage signal representative of the occurrence of a latch-up condition, i.e., with the nominal external power supply. When the on-chip power supply voltage $V_{DDI}$ becomes lower than the trigger voltage, then the power transistor and voltage regulation circuit is disabled, thereby reducing the latch-up condition. Both CMOS and NMOS implementations of the combination voltage regulation and latch-up protection circuit are disclosed.

20 Claims, 7 Drawing Sheets

VOLTAGE REGULATION AND LATCH-UP PROTECTION CIRCUITS

BACKGROUND OF THE INVENTION

1. Technical Field

The present invention relates in general to integrated circuit chips having a voltage regulator as an on-chip power supply and, more particularly, to a latch-up protection circuit which prevents damage to a CMOS integrated circuit chip due to transient surges or internal-circuitry initiated latch-ups and which interrupts and clears any latch-up condition or SCR mode.

2. Background Art

As is well known, in the conventional fabrication of integrated circuits, an epitaxial layer doped with one ion type is grown on the surface of a substrate doped with a second ion type and then various impurities are diffused into the epitaxial layer to create the requisite elements (e.g., gate, channel, etc.) of the desired electronic device. The diffusion process, in addition to forming the desired electronic device, can also create what is known in the art as a parasitic transistor which may exist between a diffusion region, the epitaxial layer and the substrate. When a CMOS inverter stage is formed, a pair of parasitic transistors are formed which have the configuration of a silicon controlled rectifier (SCR) circuit.

The parasitic transistors remain inactive during the normal operation of the integrated circuit and therefore generally do not have an effect. However, a transient surge or electrostatic discharge may change the relative electrical characteristics of one or more of the diffusion regions enough so that the regions which comprise the parasitic SCR circuit become conductive and current passes through portions of the various layers of the integrated circuit unintended for such current flow. Such a phenomenon is referred to as "latch-up" condition). The latch-up condition can be especially destructive to CMOS integrated circuits, since they and their associated components are designed to normally draw small quantities of current. An integrated circuit may be cleared of the latch-up condition by reducing the input voltage or current below the sustaining voltage or sustaining current, respectively, the value of which may vary according to the integrated circuit experiencing the condition.

When a latch-up condition occurs, the integrated circuit appears as a very low impedance across the output of a voltage regulator which may be used to drive the integrated circuit. Thus, it not only becomes necessary to limit the current input tot he integrated circuit for protection, but also to clear the integrated circuit of the latch-up condition so that the voltage regulator and the integrated circuit may again function properly.

CMOS technology has strived to develop processing features which result in greater degrees of latch-up immunity. Features such as guard rings, epi wafers, N-well spacing restrictions, retrograde N-well, and TiSi junctions have each been used to improve the latch-up resistance of today's CMOS technology. Unfortunately, present processing enhancements do not provide complete latch-up immunity. Only if the latch-up hold voltage is greater than the chip power supply voltage can a chip be considered latch-up free. Maintaining such a condition, however, is not always realistic given layout and design constraints.

The general principal of any latch-up protection circuit is to interrupt the latch-up current before damage occurs to the integrated circuit chip. Latch-up current generally flows from an external power supply to ground and its interruption requires removing (or lowering) the external power supply voltage or isolating the external supply from the on-chip power supply by means of a switching device. Such a switching approach is described in U.S. Pat. No. 4,594,633, issued to Townsend et al. and entitled "Integrated Circuit Protection Circuit". Briefly, this circuit comprises a "crow bar" type of circuit which responds to an over current condition to the load by adding a short circuit across the load. A predetermined time after the latch-up condition is detected, normal operation is automatically restored. However, there is no open circuiting to reset the latch-up condition. Further, adding a power switching device solely for the purpose of preventing latch-up is often undesirable because of the cost involved.

Recent progresses in CMOS technology have necessitated a lower internal power supply voltage than the conventional five volt external power supply due to reliability concerns of the shorter channeled CMOS devices. Integrated circuit chips which utilize an on chip voltage regulator to provide this lower chip voltage from a higher external voltage supply present a unique opportunity for latch-up protection circuitry. Since all the chip current is channeled through the voltage regulator, except for a few biasing circuits consuming a few tens of micro amps, the possibility exists to introduce a circuit which interrupts the flow of current within the voltage regulator after the detection of a latch-up condition within the integrated circuit chip. The present invention is directed to implementation of such a unique approach.

DISCLOSURE OF INVENTION

Briefly described, the present invention comprises in one aspect a latch-up protection circuit for a CMOS integrated circuit chip having internal circuitry and a voltage regulator which supplies power: to the internal circuitry. The latch-up protection circuit includes nonresistor determining means for unintrusively obtaining a signal proportional to the current output from the voltage regulator to the internal circuitry of the CMOS integrated circuit chip. In addition, switching means are provided for switching off the on-chip voltage regulator once the regulator supplied current to the internal circuit of the CMOS integrated circuit chip exceeds a preset value. The preset value is chosen such that a current value in excess thereof is necessarily indicative of a latch-up condition in the internal circuitry of the CMOS integrated circuit chip. In one specific embodiment, the voltage regulator includes a power transistor and the nonresistor determining means determines a signal proportional to the current passing through the power transistor averaged over a period of time. This averaged current signal is then used to determine whether latch-up condition exists within the internal circuitry of the CMOS integrated circuit chip.

In another aspect, a combination regulation and protection circuit for a CMOS integrated circuit chip, which receives an external power signal and supplies internal chip circuitry, is provided. The combination includes an on-chip voltage regulation means which has a power transistor for providing a substantially constant voltage signal to the internal circuitry of the CMOS integrated circuit chip using the received external power signal. Further, the circuit includes on-chip latch-up protection unintrusively detecting a power transistor output signal (either voltage or current) corresponding to a predefined level. The predefined level is representative of initation of a latch-up condition within the internal circuitry of the CMOS integrated circuit chip. The protection means also includes switching means for switching off the power transistor of the on-chip voltage regulation means once the predetermined output level is detected at the power transistor. In a preferred embodiment of this implementation, the detected signal comprises the average current passing through the power transistor.

In another aspect, the present invention comprises an on-chip latch-up protection circuit for a CMOS integrated circuit chip which has an internal circuit and a voltage regulator supplying the internal circuit. This protection circuit includes voltage means for providing a trigger reference voltage signal and unintrusive detection means for detecting the voltage signal supplied by the on-chip voltage regulator to the internal chip circuitry. A comparator compares the reference voltage signal with the regulator supplied voltage signal and decision circuitry switches off the on-chip voltage regulator if the difference between the reference voltage signal and the regulator supplied voltage signal is less than a predefined value. The predefined value is selected such that a voltage difference signal lesser than said value is indicative of a latch-up condition in the internal circuitry of the CMOS integrated circuit chip. More specific details of all aspects of the present invention are described and claimed herein.

The present invention advantageously provides an improved protection circuit which is able to interrupt the flow of power from a power transistor of an on-chip voltage regulator to internal chip circuitry prior to destruction of the internal chip circuitry due to a latch-up condition. The latch-up protection circuit is preferably implemented as a combined voltage regulation and latch-up protection circuit, which requires little chip real estate and is latch-up proof for all internal circuitry initiated latch-ups. The circuits of the present invention may be implemented either as CMOS circuits or NMOS circuits. In addition, the latch-up protection circuit consumes little (NMOS version) or no (CMOS version) dc power. Further, the circuits presented herein are simpler to implement than more conventional approaches of using on-chip operational amplifiers to detect unusually low voltage levels. Also, separate power on detection circuitry is unncessary.

BRIEF DESCRIPTION OF THE DRAWINGS

These and other objects, advantages and features of the present invention will be more readily understood from the following detailed description of certain preferred embodiments thereof, when considered in conjunction with the accompanying drawings in which.

BEST MODE FOR CARRYING OUT THE INVENTION

Reference now should be made to the drawings in which the referenced numbers are used throughout the different figures to designate the same or similar components.

Figure 1:
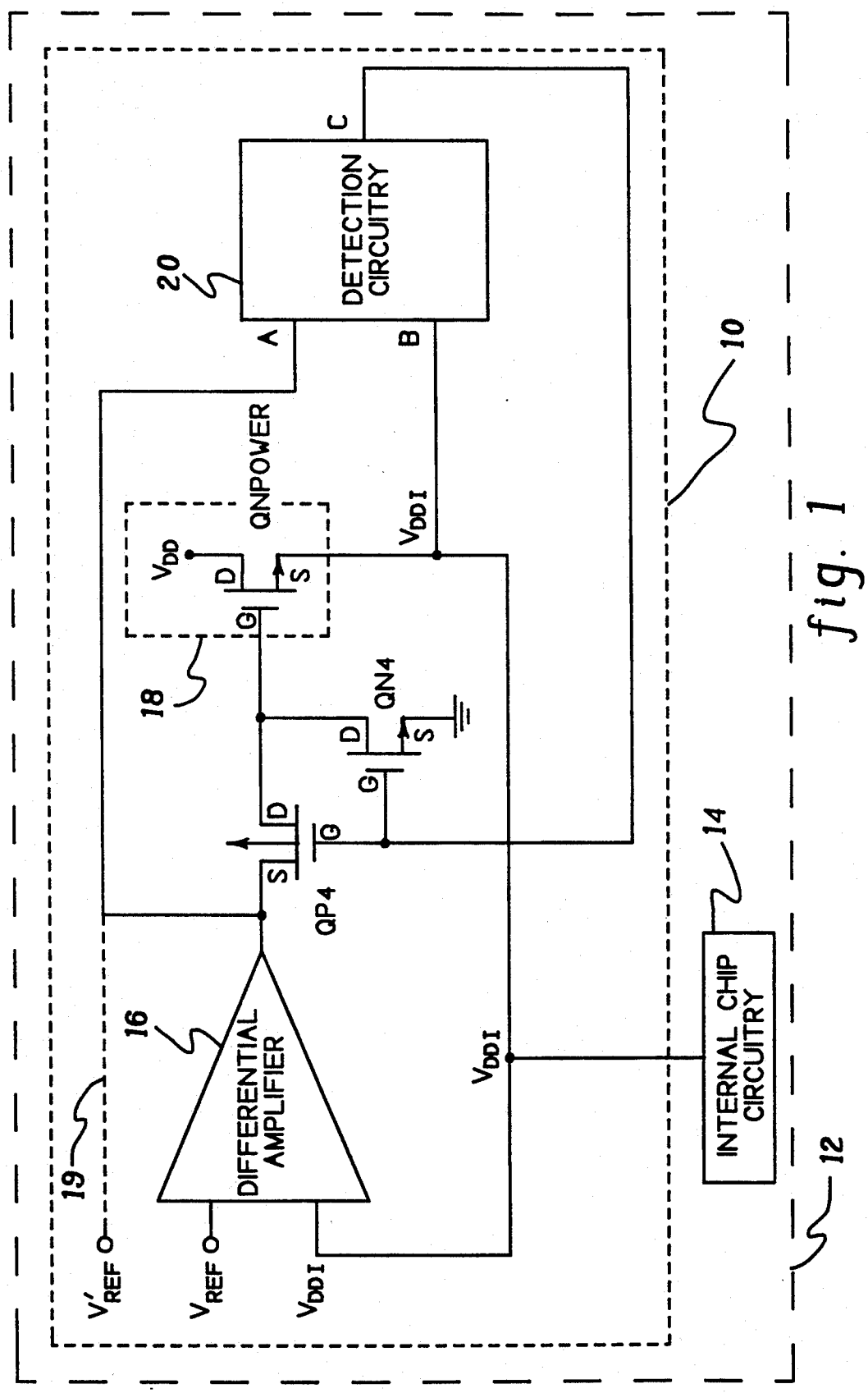
FIG. 1 is a combined schematic and block diagram of one CMOS embodiment of a voltage regulation and latch-up protection circuit of the present invention.

Referring initially to FIG. 1, the present invention provides in one important aspect a combination voltage regulation and latch-up protection circuit, generally denoted 10, for an integrated circuit chip 12. During normal operation, circuit 10 provides integrated circuit chip 12 with a constant voltage, e.g., 3.6 volts, from an external power supply, such as a 5 volts supply. In all aspects of the invention, the principle behind the protection circuit is to interrupt a latch-up current emitted from the voltage regulation portion of the circuit prior to damage occurring within an associated internal chip circuitry 14.

One approach to implementing the latch-up protection aspect of the present invention is to unintrusively detect the on-chip power supply voltage (herein referred to as $V_{DDI}$) output by circuit 10 to internal chip circuitry 14 and compare this voltage signal to a trigger voltage value. This trigger voltage value is chosen to be close to the anticipated on-chip power supply voltage $V_{DDI}$ when a latch-up condition is known to exist, i.e., with the nominal external power supply. For example with the voltage values stated above, the trigger voltage might typically be one (1) volt or lower. When the on-chip power supply voltage $V_{DDI}$ becomes lower than the trigger voltage level, then the power transistor of the voltage regulation circuit is disabled and $V_{DDI}$ is reduced to zero, thereby removing a latch-up condition. This embodiment is discussed further below with reference to the detailed description of FIG. 1.

An alternate and preferred approach to implementing the latch-up protection aspect of the present invention is to detect an average current value through the power transistor of the voltage regulation circuit over a few microseconds. Should this current be larger than a preset value, then the power transistor is turned off and the on-chip power supply voltage $V_{DDI}$ is reduced to zero, thereby removing a latch-up condition. A non-intrusive technique for accomplishing measurement of the average current through the power transistor is attained by first measuring the gate to source $V_{GS}$ voltage of the power transistor and then deducing therefrom the drain to source current $I_{DS}$ from known device characteristics of the power transistor. The maximum average $I_{DS}$ is predetermined by setting a limit on the maximum allowed average $V_{GS}$ over a few microseconds. A hardware implementation is presented for controlling the gate of the voltage regulator's power transistor.

Referring specifically to the implementation of FIG. 1, the current sensing method utilized by the latch-up protection circuitry of the present invention is initially described herein. A two input, one output differential amplifier 16 receives at a first input a reference voltage $V_{REF}$ and at a second input the on-chip power supply voltage $V_{DDI}$ supplied to internal chip circuitry 14 of CMOS integrated circuit chip 12. Typically, a reference generator will supply the reference voltage $V_{REF}$, which for today's CMOS applications will be in the range of 3.3-3.6 volts.

The output of amplifier 16 is tied to the source "S" of a PMOS transistor QP4, the drain "D" of which is tied to the gate "G" of the power transistor 18 (QNPOWER). The gate "G" of transistor QP4 is connected to the output C of a detection circuitry 20, which is described below with reference FIG. 2. During normal operation, gate "G" of transistor QP4 is held low, meaning that the output of amplifier 16 is fed directly to the gate "G" of power transistor QNPOWER. Also coupled to the gate "G" of transistor QNPOWER is the drain "D" of an NMOS transistor QN4, the source of which is grounded. The gate "G" of transistor QN4 is also controlled by output C of detection circuitry 20. As noted, during normal operation detection circuitry output C is low, which means that transistor QN4 will be non-conducting. The drain "D" of NMOS transistor QNPOWER is tied to the external chip power supply voltage $V_{DD}$ and it's source "S" outputs the on-chip or internal power supply voltage $V_{DDI}$ to internal chip circuitry 14.

Detection circuitry 20 has a first input, input A, connected to the output of amplifier 16 (which as not ed is coupled to the gate "G" of power transistor QNPOWER during normal operation of the combination voltage regulation and latch-up monitoring circuit 10). A second input ut B, is tied to the source "S" of QNPOWER such that during normal operation the difference between input A and input B comprises the gate to source voltage $V_{GS}$ of the power transistor 18. (During design of detection circuitry 20, the drain to source current $I_{DS}$ is readily deduced from known QNPOWER device characteristics and received gate to source voltages $V_{GS}$.) As already noted, output C of detection circuitry 20 is fed to the gates "G" of transistors QP4 and QN4. If a latch-up condition is detected, then output C of circuitry 20 becomes high which opens transistor QP4 and activates transistor QN4 such that the gate "G" of power transistor QNPOWER is switched to ground thereby turning the NMOS transistor 18 off and interrupting the flow of current from transistor 18 to internal chip circuitry 14.

Figure 2:
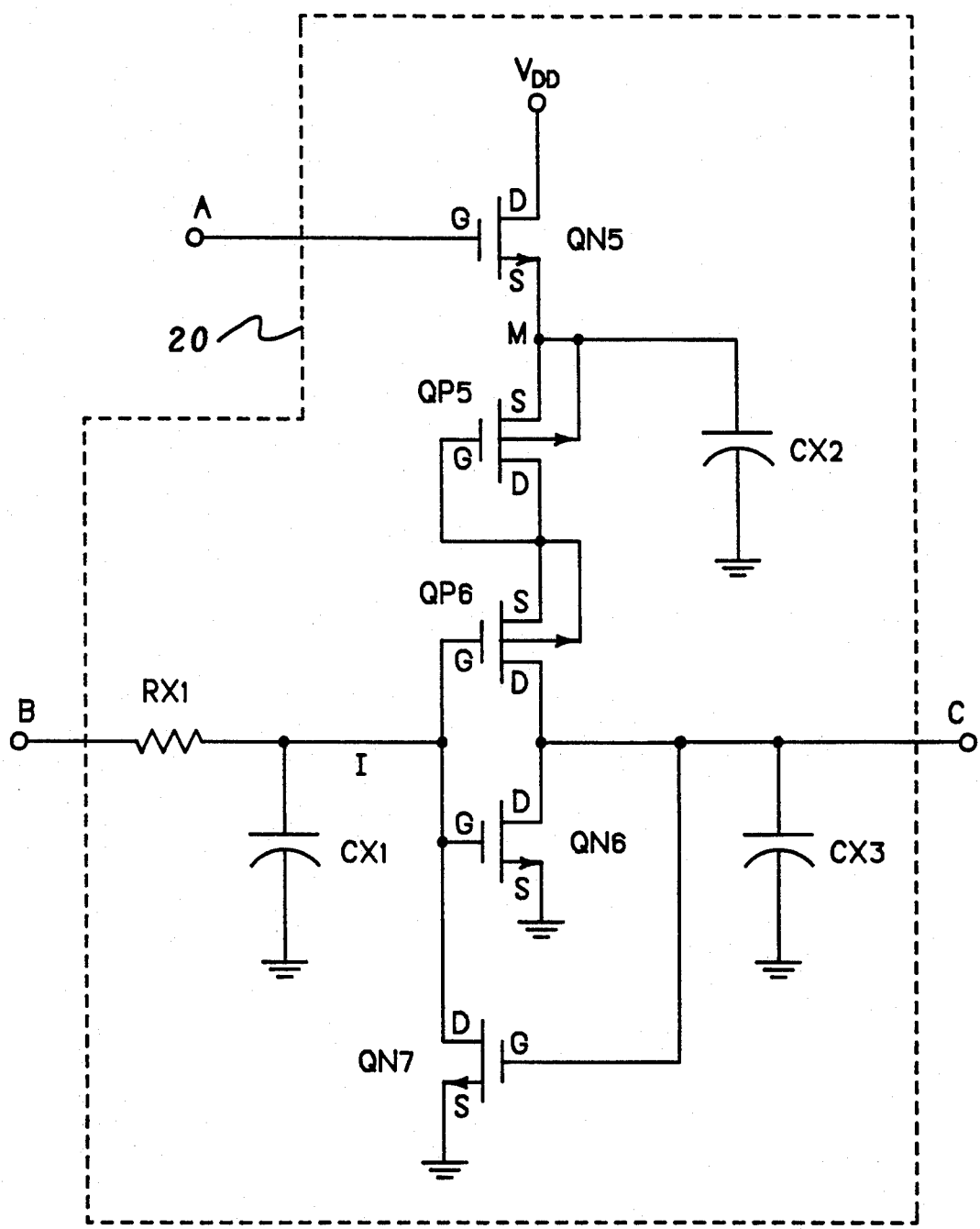
FIG. 2 is a schematic of one embodiment of the detection circuitry of FIG. 1.

One embodiment of current sensing circuitry 20 is depicted in FIG. 2. As shown, circuitry 20 includes a series connection of devices, namely transistors QN5, QP5, QP6 and QN6, along with an RC averaging circuit RX1 and CX1 and a feedback half latch QN7. In particular, input A to circuit 20 is tied to the gate "G" of an NMOS transistor QN5, which has its drain "D" connected to external power supply voltage $V_{DD}$ and its source "S" tied to the source "S" of two series connected PMOS transistors QP5 and QP6, each of which is connected in diode configuration. The connected sources "S" of transistors QN5 and QP5 define a node M which is also tied to a first terminal of a capacitor CX2, the second terminal of which is connected to ground. Capacitor CX2 operates to stabilize the voltage at node M.

The first transistor QP5 of the to diode configured transistors QP5 and QP6 has its N-well connected to node M, and its gate "G" and drain "D" connected together. The gate "G" and drain "D" of transistor QP5 are also connected to the source "S" and N-well of transistor QP6. The gate "G" of transistor QP6 is labeled node I, which also connects to the RC averaging circuit RX1 and CX1. In particular, the gate "G" of transistor QP6 is connected to one terminal of capacitor CX1, the second terminal of which is grounded, and is also connected to one terminal of resistor RX1, the second terminal of which is connected to input B of circuit 20. The drain "D" of transistor QP6 is coupled directly to output C of circuitry 20. Output C also preferably connects to first terminal of a stabilizing capacitor CX3, the second terminal of which is grounded. Further, node I connects to the gate "G" of an NMOS transistor QN6, the drain "D" of which is connected to the drain "D" of PMOS transistor QP6. The source "S" of transistor QN6 is grounded. Feedback half-latch QN7 has its gate "G" connected to output C, drain "D" connected to node I, and source "S" grounded.

During normal operation, the reference voltage $V_{REF}$ is at a specified voltage, for example, 3.3 volts. With an external power supply of approximately 5 volts, the voltage at input A is about 4 volts, which is higher than the internal power supply voltage $V_{DDI}$ (3.3 volt) by approximately the threshold voltage $V_{TN}$ (i.e., 0.7 volts) of the power transistor QNPOWER. With input A voltage being approximately 4 volts, the voltage at node M will be approximately 3.3 volts i.e., the same voltage as the internal power supply voltage $V_{DDI}$. Because transistors QP5 and QP6 are connected in diode configuration, and because the voltage at both ends of these two series connected transistors is substantially identical, the devices are in an off state. With these transistors off, output C from circuit 20 is low, which as noted above, maintains transistors QP4 and QN4 on and off, respectively, meaning that the voltages at input A and gate "G" to power transistor QNPOWER are equal.

Once a latch-up condition is initiated, internal circuitry 14 presents a small resistance which rapidly increases the current output from transistor QNPOWER and reduces its source "S" voltage ($V_{DDI}$). Since input B to detection circuitry 20 receives internal power supply voltage $V_{DDI}$ the voltage at node I thereof decreases with a time constant determined by RX1 and CX1 (e.g., a typical value might be 1.6 microseconds). Notwithstanding this decrease, node M remains relatively constant and as node I drops below node M by two threshold voltages (i.e., the threshold voltage drops of transistor QP5 and QP6) output C rises to a positive value. This then turns on transistor QN7, which further discharges node I and helps output C to rise faster. A high voltage at output C of detection circuitry 20 disables transistor QP4 and activates transistor QN4 to short the gate "G" of power transistor QNPOWER to ground. The triggering of the latch-up protection process is initiated when the average voltage difference between the gate "G" of power transistor QNPOWER and its source "S" ($V_{DDI}$) is larger than the sum of the magnitudes of the threshold voltages of 3 devices, i.e., transistors QN5, QP5 and QP6. A particular trigger current can be easily calculated from the triggering voltage using the known $I_{DS}$ vs. $V_{GS}$ characteristic of the particular power transistor QNPOWER used.

As noted initially, a second approach to implementing the latch-up protection aspect of the present invention is to detect the on-chip power supply voltage $V_{DDI}$ output by combination circuit 10 to internal chip circuitry 14 and compare this voltage signal to a trigger voltage value comparator compares this trigger reference voltage with the supply voltage $V_{DDI}$, and decision circuitry switches off the on-chip power supply if the difference between the trigger reference voltage signal and $V_{DDI}$ is less than a predefined value. The predefined value is selected such that a voltage difference signal less than the predefined value is indicative of a latch-up condition in the internal circuitry of the CMOS integrated circuit chip. In some cases, for example, the power supply may simply be switched off when $V_{DDI}$ falls below the trigger voltage. With such an approach, the combination circuit 10 would be essentially as shown in FIG. 1 with the exception that input A to detection circuitry 20 would be coupled (line 19) directly to a second reference voltage level $V'_{REF}$, for example, of one volt or less. When the on-chip power supply voltage $V_{DDI}$ at input B to circuit 20 becomes lower than the trigger voltage at input A, then the power transistor of the voltage regulation circuit would be disabled and $V_{DDI}$ would be reduced to zero. The required detection circuitry 20 modifications to implement such an approach can be accomplished by one skilled in the art. Further, as discussed above, this approach may be implemented in either CMOS or NMOS.

Figure 3:
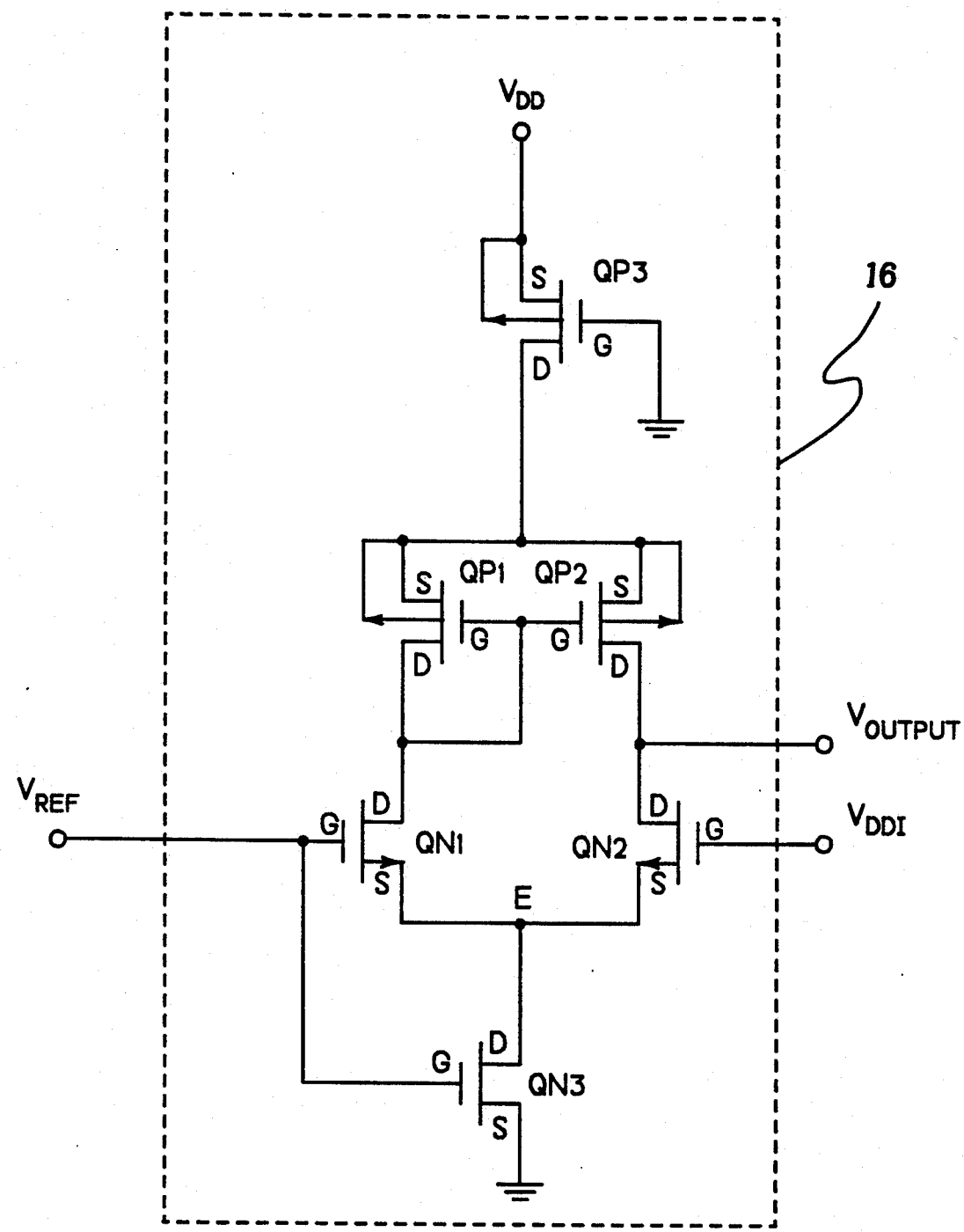
FIG. 3 is a schematic of one embodiment of the differential amplifier of FIG. 1.

To complete the description of the circuitry of FIG. 1, a typical CMOS implementation of a differential amplifier 16 is depicted in FIG. 3. Again, amplifier 16 receives as an input a reference voltage $V_{REF}$ and the internal power supply signal $V_{DDI}$. During normal operation, the output voltage $V_{OUTPUT}$ is fed across transistor QP4 to the gate "G" of power transistor QNPOWER. Transistors QN1, QN2, QP1, and QP2 are configured as a current mirror circuit with transistors QN3 and QP3 operating to provide a bias to the circuit. In this conventional configuration, the gates "G" of transistors QN1 and QN3 receive the reference voltage $V_{REF}$, while the gate "G" of transistor QN2 receives the internal power supply voltage $V_{DDI}$. The sources "S" of transistors QN1 and QN2 are tied together to form a node E. The drain "D" of transistor QN3 is also tied to node E, while its source "S" is connected to ground. The drain "D" of transistor QN1, along with being coupled to the drain "D" of transistor QP1, is connected to the control gates "G" of transistors QP1 and QP2. The sources "S" and N-wells of transistors QP1 and QP2 are also connected together, while the drain "D" of transistor QP2 is connected to the drain "D" of transistor QN2. The commonly connected sources "S" of transistors QP1 and QP2 are connected to the drain "D" of transistor QP3, which as shown, has its gate "G" coupled to ground. The source "S" and N-well of transistor QP3 is connected to external power supply voltage $V_{DD}$.

With the FIG. 3 embodiment of amplifier 16 and FIG. 2 embodiment of detection circuitry 20, it is possible that during external power supply initiation (with node I of circuit 20 at zero volts) the voltage regulating-/latch-up protection circuitry might interpret the low voltage at node 1 and higher voltage at node M as a latch-up condition, and thereby immediately deactivate power transistor QNPOWER. Extensive testing, however, has established that this is unlikely in any practical implementation. Faster ramp on rates than such a circuit would experience in any known system implementation have been simulated. Specifically, circuit 10 failed to show any power on problem with a $V_{DD}$ ramp rate of 4.4 volts/100 nanoseconds with a $V_{REF}$ ramp rate smaller than 2.9 volts/300 nanoseconds. Notwithstanding this, a power on problem could be experienced if the reference voltage $V_{REF}$ ramp rate is faster than the RC time constant of node I (defined by RX1 and CX1), for example, 1600 nanoseconds. With a faster external power supply $V_{DD}$ ramp rate, node M will rise faster than node I and the circuit will erroneously identify the difference as a latch-up condition in internal chip circuitry 14. Even though such a reference voltage $V_{REF}$ ramp rate is not anticipated in any practical situation, a modification to amplifier 16 is shown in FIG. 4 which will address any such potential problem.

Figure 4:
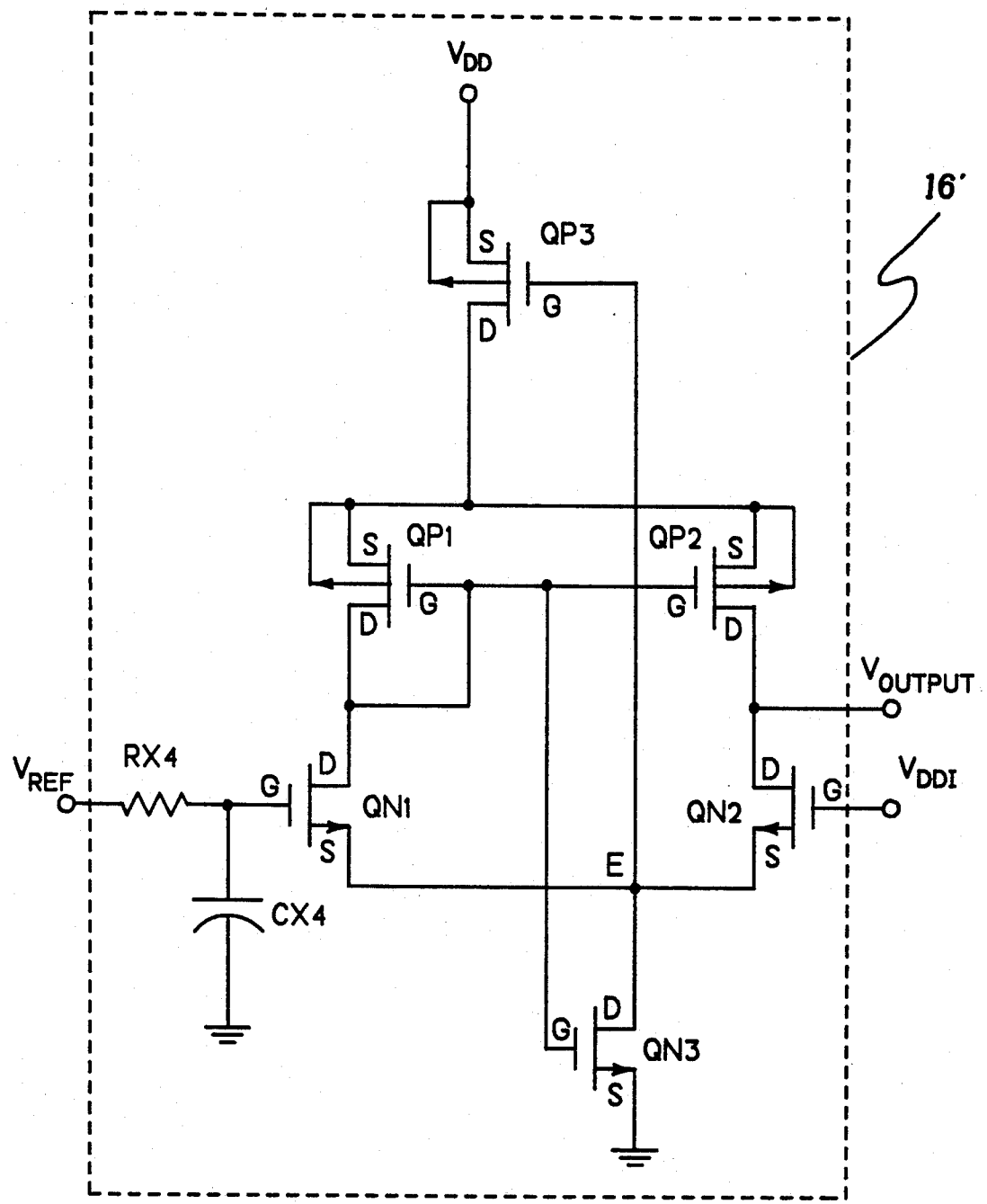
FIG. 4 is a schematic of an alternate embodiment of the differential amplifier of FIG. 1.

As depicted in FIG. 4, differential amplifier 16' includes a current mirror composed of transistors QN1, QN2, QP1 and QP2, along with biasing circuitry QP3 and QN3. In addition, a time constant RX4 and CX4 has been added to the voltage reference $V_{REF}$ input and the control signals for the gates "G" of transistor QP3 and QN3 have been modified. When configured as shown, the current flowing from external power supply $V_{DD}$ to ground through the current mirror circuit has less dependence on the external power supply voltage $V_{DD}$ than in the embodiment of FIG. 3. Amplifier 16' is identical to amplifier 16 of FIG. 3 except that the gate "G" of PMOS transistor QP3 is tied to node E and the gate "G" of NMOS transistor QN3 is tied to the gates "G" of transistors QP1 and QP2. Simulations using this configuration have been conducted with RX4 and CX4 being chosen such that the voltage at gate "G" to transistor QN1 rises at substantially the same rate as the voltage at node I of detection circuitry 20 (FIGS. 1 and 2). In such a case, no power-on problems were observed. Also, an important advantage of the circuit implementations of FIGS. 1-4 is that little dc power is consumed by the circuit due to the CMOS implementations.

Figure 5:
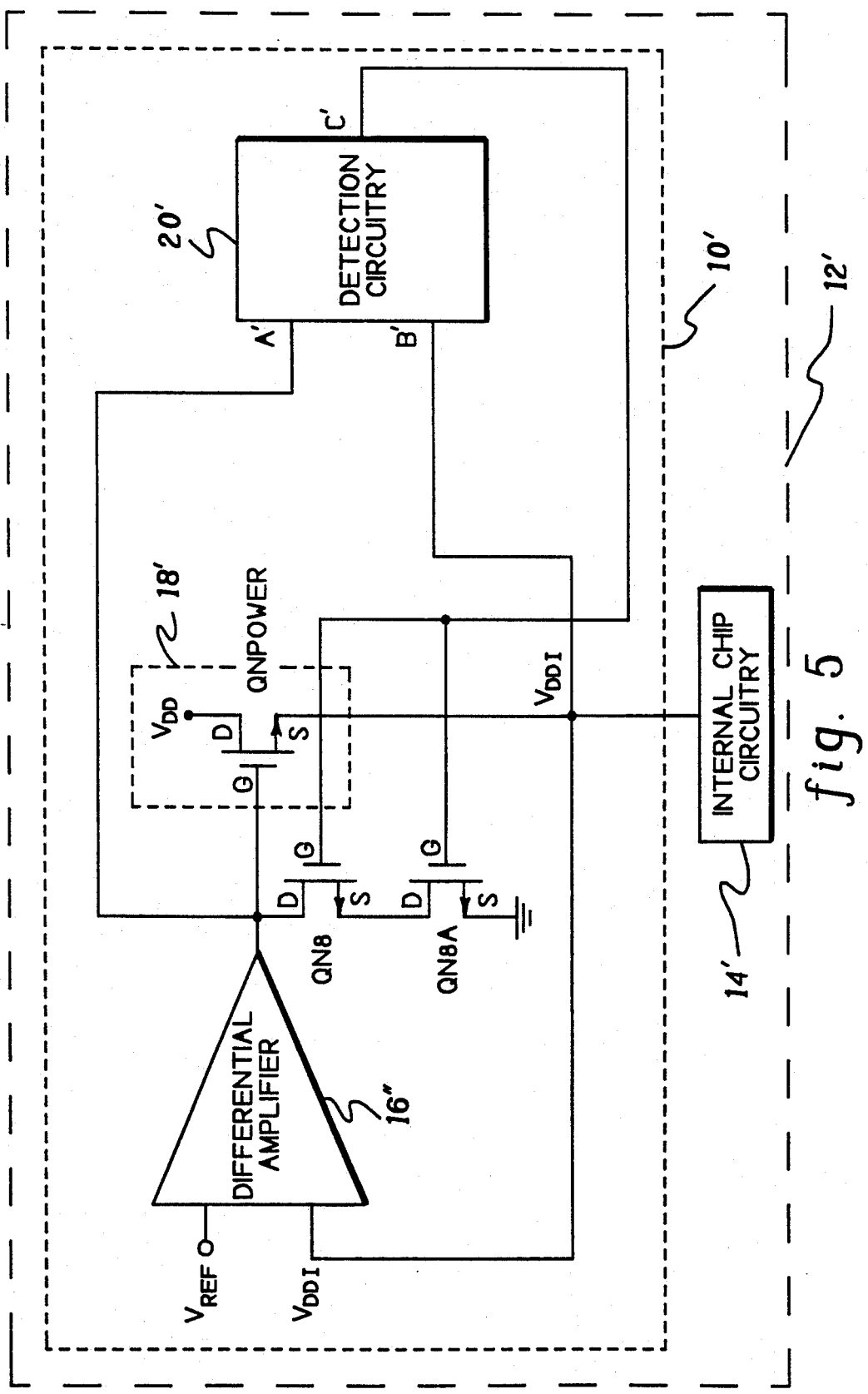
FIG. 5 is a combined schematic and block diagram of one NMOS embodiment of a voltage regulation and latch-up protection circuit of the present invention.

The same principles of current detection can also be implemented with only NMOS devices at a modest increase in the amount of dc standby current. FIG. 5 depicts an overview of such an embodiment. Since only NMOS devices are used in this implementation, the circuit is necessarily more robust that the counterpart CMOS implementation in terms of latch-up immunity. As with the initial implementations, this embodiment of the present invention comprises a combination voltage regulation and latch-up protection circuitry 10' which is located on an integrated circuit chip 12' which also includes an internal chip circuit 14'.

Combination circuit 10' includes a differential amplifier 16" which has a first input and a second input for receiving the reference voltage $V_{REF}$ and the internal power supply voltage $V_{DDI}$, respectively. The output voltage from amplifier 16" is fed to the gate "G" of a power transistor 18' QNPOWER. Transistor QNPOWER has its drain "D" connected to external power supply voltage $V_{DD}$ and its source "S" outputs the internal power supply voltage $V_{DDI}$ to internal chip circuitry 14'. As with the previous embodiments, detection circuitry 20' has an input A' coupled to the output of differential amplifier 16" for receiving the output voltage $V_{OUTPUT}$ therefrom and an input B' coupled to the source "S" of power transistor QNPOWER for receiving the internal power supply voltage $V_{DDI}$. The output C' from circuitry 20' is fed back to control the gates "G" of two series connected NMOS transistors QN8 and QN8A.

As shown, the source "S" of transistor QN8A is coupled to ground, while the drain "D" thereof is connected to the source "S" of transistor QN8, which has its drain "D" connected to the output of differential amplifier 16". (If desired, the feedback circuit could be implemented with only one NMOS transistor in place of transistors QN8 and QN8A or, alteratively, feedback could be implemented with more than two transistors.) Two transistors are used in series so that the turn on voltage for the feedback loop is higher, thereby making the entire circuit more noise insensitive. Thus, when output C' of protection circuitry 20' rises to a sufficient level, the series transistors QN8 and QN8A are activated to short the gate "G" of power transistor QNPOWER to ground thereby disabling the power transistor and interrupting the flow of power to circuit 14'.

Figure 6:
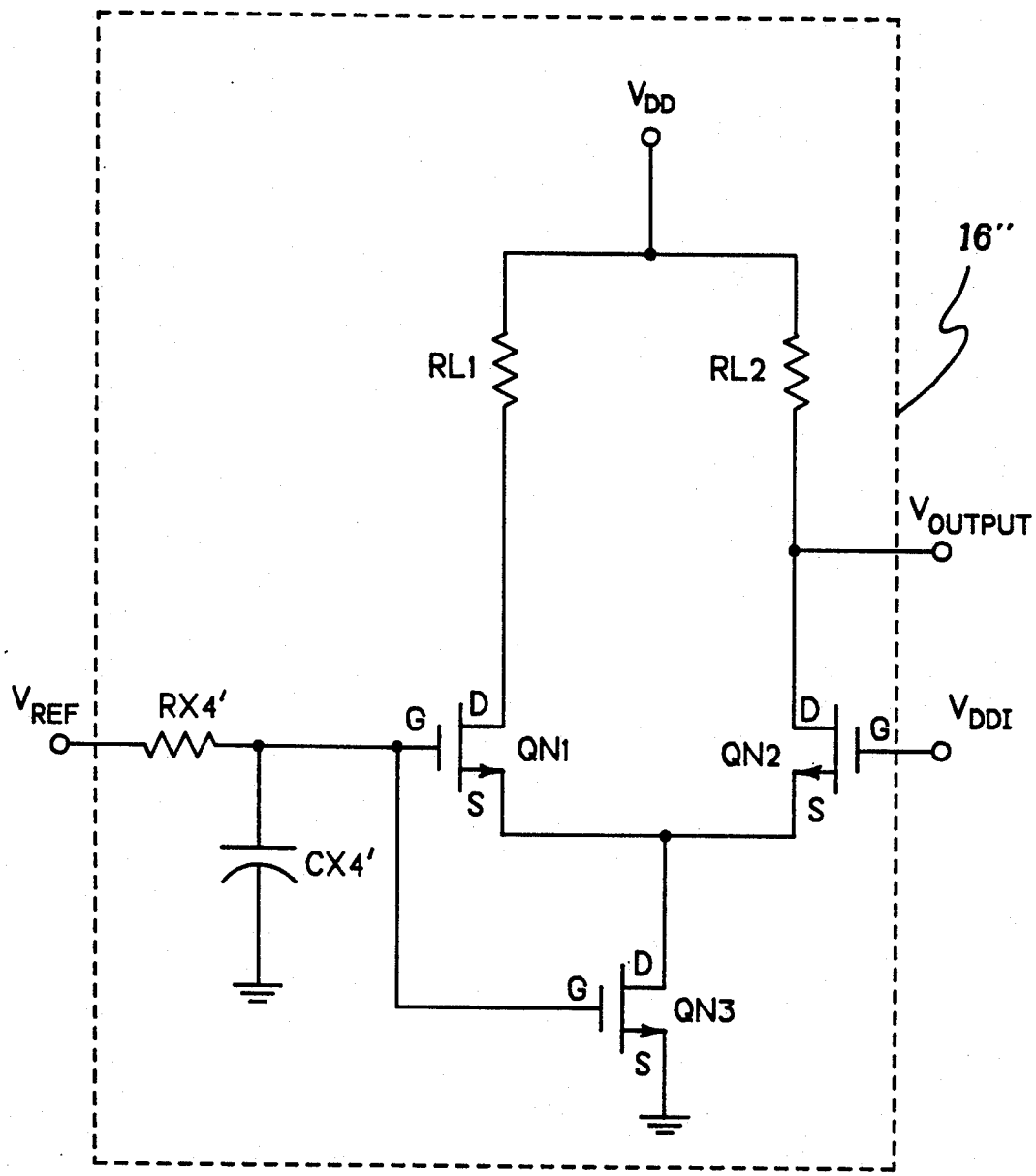
FIG. 6 is a schematic of one embodiment of the differential amplifier of FIG. 5.

FIG. 6 depicts one NMOS implementation of a differential amplifier 16" for use in the circuit embodiment of FIG. 5. In this simplified circuit 16", PMOS transistors QP1 and QP2 have been replaced by resistors RL1 and RL2, respectively. A first terminal of each of resistors RL1 and RL2 is connected to external power supply voltage $V_{DD}$. The second terminal of resistor RL1 is connected to the drain "D" of NMOS transistor QN1, which has its gate "G" connected to the reference voltage $V_{REF}$ across the RC time constant RX4' and CX4'. The second terminal of resistor RL2 is connected to the drain "D" of transistor QN2 and also to the output of amplifier 16", i.e., output voltage $V_{OUTPUT}$. Transistor QN2 is gated "G" by internal power supply voltage $V_{DDI}$. The sources "S" of transistors QN1 and QN2 are tied together at node E and the drain "D" of transistor QN3 is also connected to node E. The source "S" of transistor QN3 is grounded.

Figure 7:
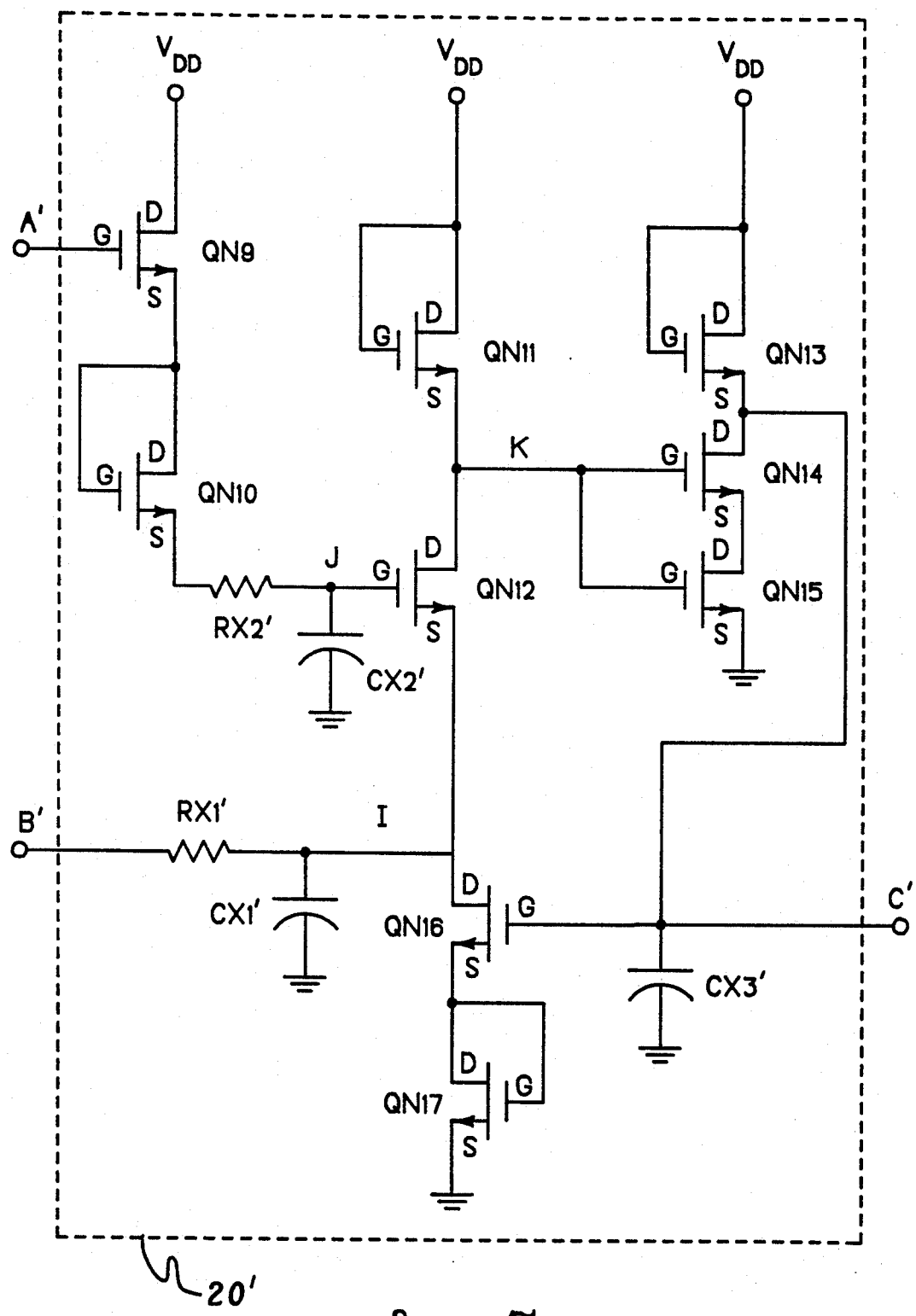
FIG. 7 is a schematic of one embodiment of the detection circuitry of FIG. 5.

A preferred implementation for NMOS detection circuitry 20' of FIG. 5 is depicted in FIG. 7. As with the prior embodiments, circuitry 20' includes a first input, input A', a second input, input B', and an output, output C', each of which is connected within circuit 10' as described with reference to FIG. 5. The signal at the gate "G" to power transistor 18' (FIG. 5) (i.e., input A') is initially fed to the gate "G" of transistor QN9, which has its drain "D" coupled to external power supply voltage $V_{DD}$ and its source "S" connected to the drain "D" of a second NMOS transistor QN10. Transistor QN10 is configured as a diode with its gate "G" connected to its drain "D". The signal at the source "S" of transistor QN10 is passed through an RC time constant defined by resistor RX2' and capacitor CX2' to a node J. The voltage at node J is input to the gate "G" of a transistor QN12. The RC time constant defined by RX2' . CX2' operates as a low pass filter and the voltage at node J of circuit 20' essentially comprises the gate voltage of the power transistor 18' (FIG. 5) offset by two threshold voltage drops, i.e., the voltage drops across NMOS transistors QN9 and QN10.

The following discussion focuses on the central leg to circuitry 20', i.e., the leg defined by transistors QN11, QN12, QN16 and QN17. Transistor QN11 has its drain "D" and gate "G" connected to external power supply voltage $V_{DD}$ and its source "S" tied to a node K. In this implementation, transistor QN11 operates as a pull-up transistor which pulls the voltage at node K towards external power supply voltage $V_{DD}$. The drain "D" of transistor QN12 is also connected to node K and the source "S" of transistor QN12 is connected to a node I, which receives the internal power supply voltage $V_{DDI}$ offset by a time constant defined by resistor RX1' and capacitor CX1'. Series connected transistors QN16 and QN17 operate as a pulldown on node I once latch-up condition is detected as described below. Transistor QN16 has its drain "D" connected to node I and its gate "G" connected to the output of circuitry 20', i.e., output C', across a stabilizing capacitor CX3'. The source "S" of transistor QN16 is coupled to both the drain "D" and gate "G" of transistor QN17, which has its source "S" connected to ground.

Stacked transistors QN13, QN14 and QN15 essentially comprise an inverter, with transistors QN14 and QN15 being coupled to provide greater noise immunity. The drain "D" and gate "G" of transistor QN13 are connected to external power supply $V_{DD}$, while the source "S" thereof is connected to the drain "D" of transistor QN14. This connection is also coupled to the output of circuit 20', i.e., output C'. Transistors QN14 and QN15 are controlled by the signal at node K, with the source "S" of transistor QN14 being coupled to the drain "D" of transistor QN15 and the source "S" of transistor QN15 connected to ground.

During normal operation, node I will follow the internal power supply voltage $V_{DDI}$ with a time constant of RX1' . CX1'. As noted, node J will typically comprise the power transistor QNPOWER gate control voltage ($V_G$) offset by two threshold voltage drops, i.e., the voltage drops across transistors QN9 and QN10. With these gate and source values, transistor QN12 is off and node K is maintained at substantially one threshold drop below external power supply voltage $V_{DD}$ by transistor QN11. A high condition on transistor QN11 forces the output signal on output C' low through the inverter composed of transistors QN13–QN15. In such a case, devices QN8 and QN8A (FIG. 5) are off and the entire circuit functions as a voltage regulator. Again, transistors QN14 and QN15 and transistors QN8 and QN8A are stacked for improved noise margins.

With initiation of a latch-up condition within circuit 14', node I will fall two threshold voltage drops $V_{TN}$ below the nominal internal power supply voltage $V_{DDI}$. By so doing, NMOS device QN12 is activated and pulls node K down. The output at output C thus rises and power transistor QNPOWER is turned off, thereby removing the on-chip power supply $V_{DDI}$. Transistor devices QN16 and QN17 are a half-latch and provide a feedback path during the shut off process.

The combination circuit embodiment of FIGS. 5–7 lacks any initial power on problem because of the RC circuit connected to the gate of transistor QN12. The gate and source of transistor QN12 have the same RC network with the same time constant. Consequently, transistor QN12 remains inactivated during the initial power on and node K is pulled high by transistor QN11. During this time, the circuit output, output C', remains low and the circuit powers up without any problem.

It will observed from the above description, that various embodiments of an improved on-chip voltage regulation and latch-up protection circuit are provided. The combination circuits provide quick shut off of power to the internal chip circuitry so that the possibility of chip damage/destruction occurring from the latch-up condition is significantly reduced, if not eliminated. In all embodiments, the combination regulation and protection circuit is small and requires minimal chip real estate to implement. In the NMOS implementation, the circuit itself is latch-up proof and consumes little or no dc power. In a preferred embodiment of the latch-up detection aspect of the circuit, a non-intrusive current sensing technique is utilized which reacts to excessive current flow through the power transistor. Further, external power-on detection circuitry is unnecessary.

While the invention has been described in detail herein in accordance with certain preferred embodiments thereof, many modifications and changes therein may be affected by those skilled in the art. Accordingly, it is intended by the appended claims to cover all such modifications and changes as fall with[n the true spirit and scope of the invention.

We claim:

1. A latch-up protection circuit for a CMOS integrated circuit chip having internal circuitry and a voltage regulator which supplies power and current to said internal circuitry, said latch-up protection circuit comprising:
   detection means having a high input impedance during normal operation for determining a signal proportional to the current output from said voltage regulator to said internal circuitry of said CMOS integrated circuit chip; and
   means for switching off said voltage regulator when said regulator supplied current to said internal circuitry of said CMOS integrated circuit chip exceeds a preset value, said preset value being such that a current value in excess thereof is indicative of a latch-up condition in said internal circuitry of said CMOS integrated circuit chip.

2. The latch-up protection circuit of claim 1, wherein said voltage regulator includes a power transistor and said detection means determines a signal proportional to the current passing through said power transistor averaged over a period of time and wherein said switching off means includes means for comparing said signal proportional to the average current through said power transistor with said preset value.

3. The latch-up protection circuit of claim 2, wherein said power transistor comprises an NMOS transistor having a gate control and wherein said switching off means includes means for grounding said gate control of said NMOS power transistor when said regulator supplied current to said internal circuitry of said CMOS integrated circuit chip exceeds said preset value.

4. The latch-up protection circuit of claim 3, wherein said voltage regulator further includes a differential amplifier, the output of said differential amplifier being coupled to the gate control of aid NMOS power transistor, said differential amplifier having two inputs, a first input receiving a reference voltage and a second input receiving a voltage signal supplied by said power transistor to said internal chip circuitry, said switching off means including means for open circuiting the connection between said output of said differential amplifier and said gate control of said power transistor.

5. The latch-up protection circuit of claim 4, wherein said differential amplifier is configured for gradual ramp-up of said voltage regulator at initial power on of said CMOS integrated circuit chip such that said latch-up protection circuit does not respond to power-on of said CMOS integrated circuit chips as an apparent latch-up condition within said internal chip circuitry.

6. The latch-up protection circuit of claim 2, wherein said detection means includes:
   means for determining the voltage at the gate of said regulator's power transistor;
   means for detecting the voltage signal supplied by said voltage regulator to said internal chip circuitry; and
   means for comparing said power transistor gate voltage and said regulator supplied voltage signal, and for determining therefrom said signal proportional to the current supplied by said power transistor to the internal circuitry of said CMOS integrated circuit chip.

7. The latch-up protection circuit of claim 1, wherein said protection circuit resides on said CMOS integrated circuit chip.

8. The latch-up protection circuit of claim 7, wherein said protection circuit comprises CMOS circuitry.

9. The latch-up protection circuit of claim 7, wherein said protection circuit comprises NMOS circuitry.

10. A combination regulation and protection circuit for a CMOS integrated circuit chip receiving an external power signal and having internal circuitry, said combination regulation and protection circuit comprising:
    on-chip voltage regulation means including a power transistor for providing a current signal and a substantially constant voltage signal to the internal circuitry of said CMOS integrated circuit chip using said received external power signal; and
    on-chip latch-up protection means having a high input impedance during normal operation for detecting a predefined value for one of the voltage and current signals output by said power transistor, sad predefined value being representative of initiation of latch-up condition within said internal circuitry of said CMOS integrated circuit chip, and for switching off said power transistor of said on-chip voltage regulation means once said predefined value is detected.

11. The combination regulation and protection circuit of claim 10, wherein said on-chip latch-up protection means detects a signal proportional to the current passing through said power transistor averaged over a period of time, and wherein said averaged current through said power transistor is compared with said predefined value by said latch-up protection means.

12. The combination regulation and protection circuit of claim 11, wherein said on-chip latch-up protection means unintrusively determines said signal proportional to the current passing through said power transistor averaged over a period of time.

13. The combination regulation and protection circuit of claim 12, wherein said signal determining means includes:
    means for determining the voltage at the gate of said power transistor of said on-chip voltage regulation means;
    means for detecting the voltage signal supplied by said on-chip voltage regulation means to said internal chip circuitry; and
    means for comparing said power transistor gate voltage and said regulation means supplied voltage signal, and for determining therefrom said signal proportional to the current supplied by said power transistor to the internal circuitry of said CMOS integrated circuit chip.

14. The combination regulation and protection circuit of claim 10, wherein said on-chip latch-up protection means comprises CMOS circuitry.

15. The combination regulation and protection circuit of claim 10, wherein said on-chip latch-up protection means comprises NMOS circuitry.

16. An on-chip latch-up protection circuit for a CMOS integrated circuit chip having internal circuitry and a voltage regulator which supplies a voltage signal to said internal circuitry, said on-chip protection circuit comprising:

means for providing a trigger reference voltage signal;

means having a high input impedance during normal operation for detecting the voltage signal supplied by said voltage regulator to said internal chip circuitry;

means having a high input impedance during normal operation for comparing said reference voltage signal and said regulator supplied voltage signal; and means for switching off said voltage regulator when the difference between said reference voltage signal and said regulator supplied voltage signal is less than a predestined value, said predefined value being such that a voltage difference signal less than said predefined value is indicative of a latch-up condition in said internal circuitry of said CMOS integrated circuit chip.

17. The latch-up protection circuit of claim 16, wherein said voltage regulator includes an NMOS power transistor having a gate control and wherein said means for switching off said voltage regulator includes means for grounding said gate control of said NMOS power transistor.

18. The latch-up protection circuit of claim 16, wherein said protection circuit comprises a CMOS circuit.

19. The latch-up protection circuit of claim 16, wherein said protection circuit comprises an NMOS circuit.

20. The latch-up protection circuit of claim 16, wherein the nominal voltage supplied by said voltage regulator to said internal chip circuitry is in the range of 3.3 to 3.6 volts, and wherein said trigger reference voltage signal is $\leq$ approximately 1 volt.

* * * * *

UNITED STATES PATENT AND TRADEMARK OFFICE
CERTIFICATE OF CORRECTION

PATENT NO. : 5,212,616
DATED : May 18, 1993
INVENTOR(S) : Dhong et al.

It is certified that error appears in the above-identified patent and that said Letters Patent is hereby corrected as shown below:

Column 2, line 43, delete ":".
Column 5, line 26, delete "not ed" and substitute therefor --noted--.
Column 5, line 30, delete "ut" and substitute therefor --input--.
Column 5, line 62, delete "to" and substitute therefor --two--.
Column 6, line 66, between "." and "comparator" insert --A--.

Column 11, line 43, delete "aid" and substitute therefor --said--.
Column 12, line 24, delete "sad" and substitute therefor --said--.
Column 13, line 14, delete "predestined" and substitute therefor --predefined--.

Signed and Sealed this

Eleventh Day of January, 1994

Attest:

BRUCE LEHMAN

Attesting Officer     *Commissioner of Patents and Trademarks*